United States Patent
Choi

(10) Patent No.: US 7,586,796 B2
(45) Date of Patent: Sep. 8, 2009

(54) CORE VOLTAGE DISCHARGE DRIVER

(75) Inventor: Jun-Gi Choi, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 23 days.

(21) Appl. No.: 11/966,608

(22) Filed: Dec. 28, 2007

(65) Prior Publication Data

US 2009/0067263 A1 Mar. 12, 2009

(30) Foreign Application Priority Data

Sep. 12, 2007 (KR) .................... 10-2007-0092521

(51) Int. Cl.
*G11C 7/00* (2006.01)
*G11C 5/14* (2006.01)

(52) U.S. Cl. ........................ 365/189.09; 365/189.07; 365/226

(58) Field of Classification Search .............. 365/204
See application file for complete search history.

(56) References Cited

U.S. PATENT DOCUMENTS 6,891,773 B2 * 5/2005 Park ...................... 365/230.06

7,417,903 B2 * 8/2008 Kim et al. ............... 365/189.09
7,492,645 B2 * 2/2009 Kang et al. ............. 365/189.09

FOREIGN PATENT DOCUMENTS

| KR | 10-2003-0053923 A | 7/2003 |
| KR | 10-0668518 B1 | 1/2007 |
| KR | 10-2007-0036619 A | 4/2007 |
| KR | 10-2007-0056661 A | 6/2007 |

* cited by examiner

*Primary Examiner*—Tan T. Nguyen
(74) *Attorney, Agent, or Firm*—Mannava & Kang, P.C.

(57) ABSTRACT

A core voltage discharge driver prevents a core voltage discharging operation from interrupting the core voltage generating operation. The core voltage discharge driver includes a comparing unit configured to compare a core voltage generating control signal for controlling generation of a core voltage with a core voltage discharging control signal for controlling discharge of the core voltage, and an adjusting unit configured to adjust the core voltage discharging control signal based on a comparison result of the comparing unit.

14 Claims, 5 Drawing Sheets

CORE VOLTAGE DISCHARGE DRIVER

CROSS-REFERENCE TO RELATED APPLICATIONS

The present invention claims priority to Korean patent application number 10-2007-0092521, filed on Sep. 12, 2007, which is incorporated by reference in its entirety.

BACKGROUND OF THE INVENTION

The present invention relates to a core voltage discharge driver.

In a memory device such as a dynamic random access memory (DRAM) device, a unit cell generally includes one transistor and one capacitor in which electric charges are stored as data. Since the capacitor formed on a semiconductor substrate is not fully electrically insulated from other components, the stored electric charges are discharged. That is, due to generation of a leakage current, data stored in the unit cell can be damaged. Accordingly, the memory device performs refresh operation periodically in order to maintain charges stored in the capacitor.

Changing internal addresses by itself, the memory device having a refresh mode performs the refresh operation in response to an external command. When the memory device enters the refresh mode in response to the external command, row addresses are increased in order and word line of corresponding memory cells is selected. A sense amplifier amplifies charges stored in the corresponding memory cells and the amplified charges are restored. The data stored in the memory cell is retained through the refresh operation.

The memory device generates a voltage required by internal components using a predetermined external voltage. In a DRAM device including a bit line sense amplifier, cell data is sensed using a core voltage. When a word line is activated, data stored in a plurality of memory cells, which are connected to the activated word line, are transferred to a pair of bit lines and the bit line sense amplifier senses and amplifies the voltage difference between the bit lines.

In order to store data in memory cells of the DRAM device, the bit line sense amplifier applies data on a bit line and a complementary bit line using the core voltage and thus the capacitor of the memory cell is charged. A core voltage driver generates the core voltage. As the operating speed of the DRAM device is increasing, the memory cell should operate more rapidly, so that more rapid charging of the capacitor is required. Thus, an overdriving method may be used. According to the overdriving method, instead of the core voltage, an external voltage higher than the core voltage is used at the time when the bit line sense amplifier consumes a maximum operation current.

When the DRAM device is driven, thousands of bit line sense amplifiers start to operate at the same time. The driving time of the bit line sense amplifier is determined depending on whether a sufficient operation current for driving it can be supplied. However, due to drop of an operation voltage according to the tendency of the low power consumption, it is difficult to supply a sufficient amount of the current at a time. In order to solve this problem, an overdriving structure for the bit line sense amplifier has been adopted. That is, in an initial operation of the bit line sense amplifier, a voltage higher than a normal voltage (a core voltage) is instantaneously applied to a voltage line RTO of the bit line sense amplifier.

FIG. 1 is a circuit diagram of a conventional driver for controlling overdriving of a bit line sense amplifier.

Referring to FIG. 1, the bit line sense amplifier 10 is connected between a pair of bit lines BL and BLB, and a voltage line RTO and a voltage line SB are connected to the bit line sense amplifier 10.

A core voltage VCORE is generally supplied to the voltage line RTO, but in initial operation, a power supply voltage VDD higher than the core voltage VCORE is supplied to the voltage line RTO in order to perform a sensing operation more quickly. The core voltage VCORE is supplied to the voltage line RTO when an NMOS transistor MN2 is turned on in response to a normal driving control signal SAP2 of the bit line sense amplifier 10, and the power supply voltage VDD is supplied to the voltage line RTO when an NMOS transistor MN1 is turned on in response to a overdriving control signal SAP1 of the bit line sense amplifier 10.

The voltage line SB is connected a ground voltage (VSS) terminal through an NMOS transistor MN3.

A precharge unit 20 is enabled in response to a control signal BLEQ to precharge the bit lines BL and BLB.

The above-described driver for controlling the overdriving of the bit line sense amplifier 10 activates a particular word line (not shown). Then, a plurality of cell transistors connected to the activated word line operates and data stored a plurality of memory cells connected to the activated word line are transferred to the bit lines BL and BLB.

The NMOS transistor NM1 is turned on in response to the overdriving control signal SAP1 for driving the bit line sense amplifier 10 and the NMOS transistor NM3 is turned on in response to a control signal SAN. Thus, the power supply voltage VDD is supplied to the voltage line RTO and a ground voltage VSS is supplied to the voltage line SB. In this way, the power supply voltage VDD and the ground voltage VSS are supplied to the bit line sense amplifier 10, the bit line sense amplifier 10 senses and amplifies a voltage difference between the bit lines BL and BLB.

When the bit lines BL and BLB are developed by the bit line sense amplifier 10, a voltage supplied to the voltage line RTO is changed from the power supply voltage VDD to the stable core voltage VCORE. That is, when the overdriving control signal SAP1 transits to low level, the normal driving control signal SAP2 transits to high level to turn on the NMOS transistor MN2 and the power supply voltage VDD is replaced with the core voltage VCORE.

However, in the conventional driver for controlling the overdriving of the bit line sense amplifier 10, the core voltage (VCORE) terminal and the voltage line RTO are connected to each other via the NMOS transistor MN2. Therefore, electric charges transferred from the power supply voltage (VDD) terminal to the voltage line RTO increases the core voltage VCORE.

Accordingly, in a conventional method, in order to prevent the increase of the core voltage VCORE a core voltage discharge driver is used to discharge to the ground voltage (VSS) terminal the electric charges transferred from the power supply voltage (VDD) terminal to the voltage line RTO as illustrated in FIG. 2.

FIG. 2 is a circuit diagram of a conventional core voltage discharge driver. In the core voltage discharge driver, the op-amp OP1 receives a reference voltage VRERC and a half core voltage HALF. In a discharge driving unit, an NMOS transistor MN6 discharges a core voltage VCORE in response to an output signal DRV_CLAMP of the op-amp OP1. Dividing resistors R1 and R2 divide the core voltage VCORE to generate the half core voltage HALF. The half core voltage HALF is inputted to the op-amp OP1.

A muting unit for muting the output signal DRV_CLAMP of the op-amp OP1 in response to an inversion signal of a clamp signal CLAMP is disposed between an output terminal of the op-amp OP1 and the gate terminal of the discharge driving unit. The muting unit includes an inverter IV1 and an NMOS transistor MN5. The inverter IV1 inverts the clamp signal CLAMP. The NMOS transistor MN5 is turned on in response to an output signal of the inverter IV1. The source terminal of the NMOS transistor MN5 is connected to a ground voltage (VSS) terminal. The op-amp OP1 is connected between a power supply voltage (VDD) terminal and the ground voltage (VSS) terminal. An NMOS transistor MN4 is connected between the op-amp OP1 and the ground voltage (VSS) terminal to open and close a current path between the power supply voltage (VDD) terminal and the ground voltage (VSS) terminal. The NMOS transistor MN4 is turned on in response to the clamp signal CLAMP.

The core voltage discharge driver discharges electric charges, which are transferred from the power supply voltage (VDD) terminal, to the ground voltage (VSS) terminal. That is, when the clamp signal CLAMP is in high level, the NMOS transistor MN4 is turned on to activate the op-amp OP1. The inverter IV1 inverters the clamp signal CLAMP of high level to turn off the NMOS transistor MN5. An output signal DRV_CLAMP of the op-amp OP1 is inputted to the discharge driving unit.

Dividing resistors R1 and R2 divide the core voltage VCORE to generate the half core voltage HALF, which is inputted to the op-amp OP1. The op-amp OP1 compares the half core voltage HALF with the reference voltage VREFC. When the half core voltage HALF becomes larger than the reference voltage VREFC, the output signal DRV_CLAMP of the op-amp OP1 increases and thus the NMOS transistor MN6 for discharge is turned on to decrease a level of the core voltage VCORE.

FIG. 3 is a circuit diagram of a conventional core voltage generator.

Referring to FIG. 3, in the core voltage generator, the op-amp OP2 receives a reference voltage VRERC and a half core voltage HALF. A driving unit includes the PMOS transistor MP2 that receives the output signal DRV_ACT of the op-amp OP2 as a gate input to generate a core voltage VCORE. Dividing resistors R3 and R4 divide the core voltage VCORE to generate the half core voltage HALF, which is inputted to the op-amp OP2. The op-amp OP2 is connected between a power supply voltage (VDD) terminal and a ground voltage (VSS) terminal. An NMOS transistor MN7 is connected between the op-amp OP2 and the ground voltage (VSS) terminal to open and close a current path between the power supply voltage (VDD) terminal and the ground voltage (VSS) terminal. The NMOS transistor MN7 is turned on in response to an active signal ACT.

A PMOS transistor MP1 is connected between the output terminal of the op-amp OP2 and the gate terminal of the driving unit, and is turned on in response to the active signal ACT. When the PMOS transistor MP1 is turned on, the power supply voltage VDD is inputted to the gate terminal of the driving unit.

In the above-described core voltage generator, when the active signal ACT is in high level, the NMOS transistor MN7 is turned on to activate the op-amp OP2. The PMOS transistor MP1 is turned off in response to the active signal ACT of high level and the output signal DRV_ACT of the op-amp OP2 is inputted to the gate terminal of the driving unit.

Dividing resistors R3 and R4 divide the core voltage VCORE to generate the half core voltage HALF, which is inputted to the op-amp OP2. The op-amp OP2 compares the half core voltage HALF with the reference voltage VREFC. When the half core voltage HALF becomes less than the reference voltage VREFC, the output signal DRV_ACT of the op-amp OP2 decreases and thus the PMOS transistor MP2 is turned on to increase a level of the core voltage VCORE.

FIG. 4 is a timing diagram of a conventional core voltage discharging operation and core voltage generating operation. Referring to FIG. 4, in the core voltage discharge driver, as the output signal DRV_CLAMP of the op-amp OP1 increases, the core voltage VCORE decreases and the core voltage generator of FIG. 3 begins to operate. Thereafter, the core voltage VCORE increases due to the operation of the core voltage generator.

Referring to a period A of FIG. 4, in a part of the period A, the output signal DRV_CLAMP of the op-amp OP1 is in high level and the output signal DRV_ACT of the op-amp OP2 is in low level. At this time, in the core voltage discharge driver electric charges are discharged from the core voltage VCORE terminal. On the other hand, in the core voltage generator electric charges are supplied from the power supply voltage (VDD) terminal to the core voltage VCORE terminal.

Since the size of the PMOS transistor MP2 serving as the driving unit is larger than the size of the NMOS transistor MN6, the core voltage VCORE increases, but unnecessary current is consumed in the period A. In addition, due to decrease of the level of the core voltage VCORE, operation of the driver may be unstable.

SUMMARY OF THE INVENTION

Embodiments of the present invention are directed to providing a core voltage discharge driver for preventing a core voltage discharging operation from interrupting the core voltage generating operation.

In accordance with an aspect of the present invention, there is provided a core voltage discharge driver, including a comparing unit configured to compare a core voltage generating control signal with a core voltage discharging control signal, and an adjusting unit configured to adjust the core voltage discharging control signal based on a comparison result of the comparing unit.

In accordance with another aspect of the present invention, there is provided a core voltage discharge driver, including a core voltage generating unit configured to generate a core voltage using an external voltage, a core voltage discharging unit configured to control discharge of the core voltage by comparing a first reference voltage with the core voltage fed backed from the core voltage generating unit, and a discharge adjusting unit configured to compare a core voltage generating control signal with a core voltage discharging control signal, and to adjust a core voltage discharged in the core voltage discharging unit based on the comparison result.

DESCRIPTION OF SPECIFIC EMBODIMENTS

Hereinafter, a core voltage discharge driver in accordance with the present invention will be described in detail with reference to the accompanying drawings.

Figure 5:
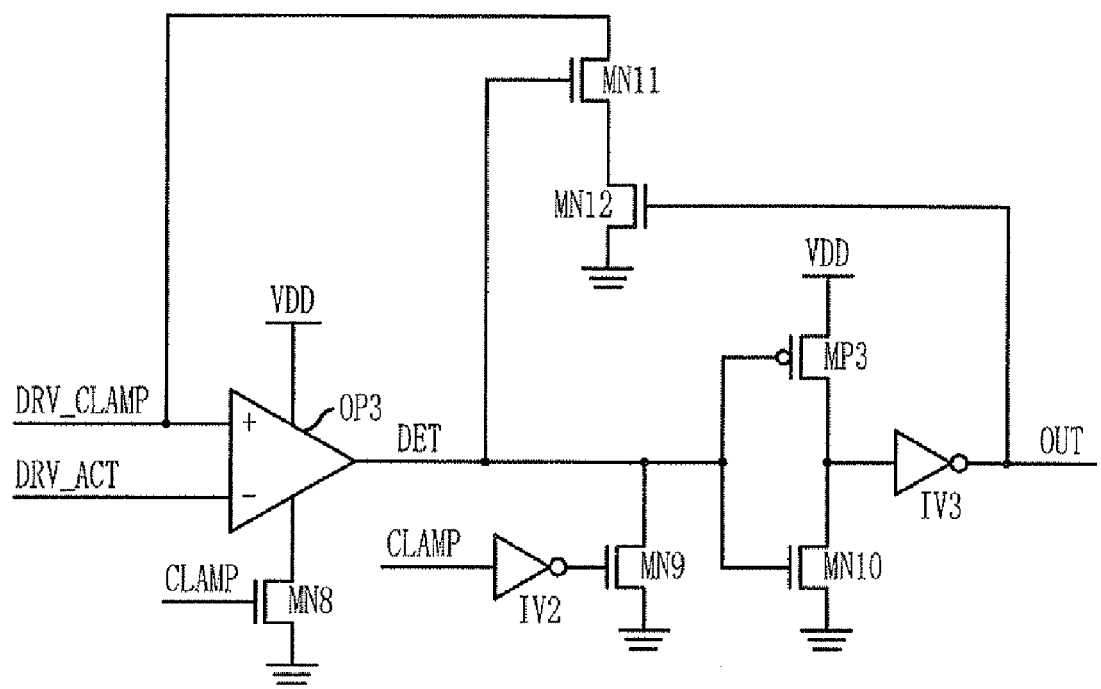
FIG. 5 is a circuit diagram of a core voltage discharge driver in accordance with an embodiment of the present invention.

FIG. 5 is a circuit diagram of a core voltage discharge driver in accordance with an embodiment of the present invention.

Figure 1:
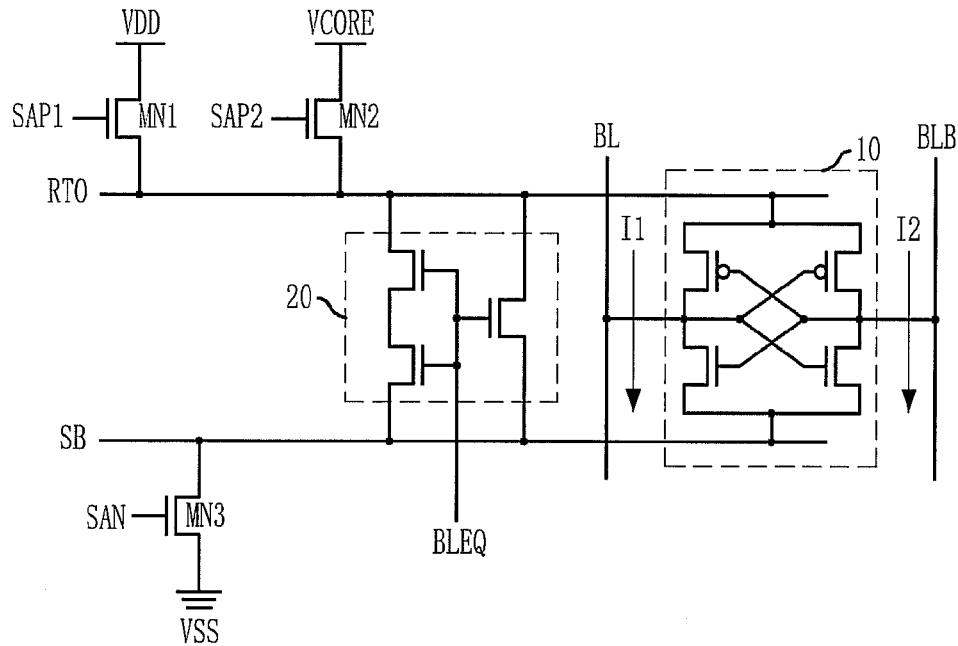
FIG. 1 is a circuit diagram of a conventional driver for controlling overdriving of a bit line sense amplifier.
Figure 2:
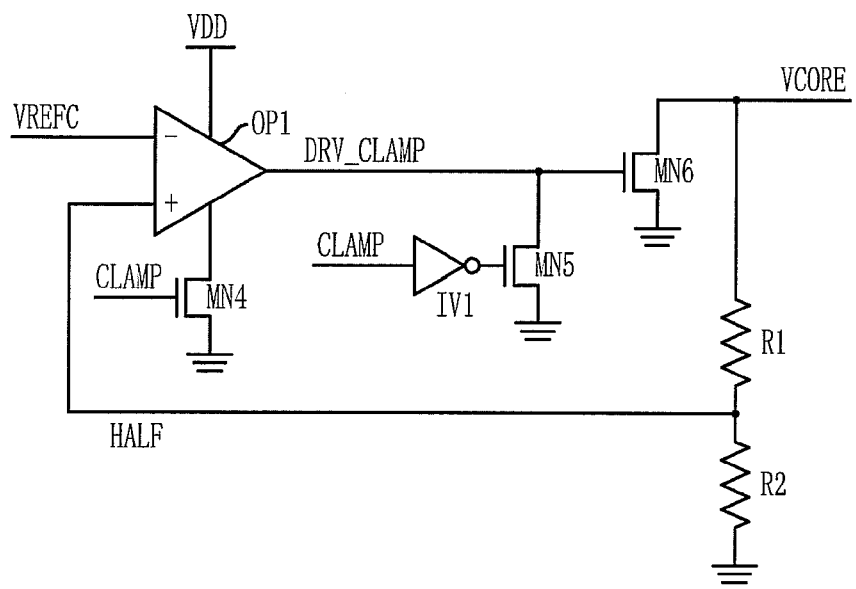
FIG. 2 is a circuit diagram of a conventional core voltage discharge driver.
Figure 3:
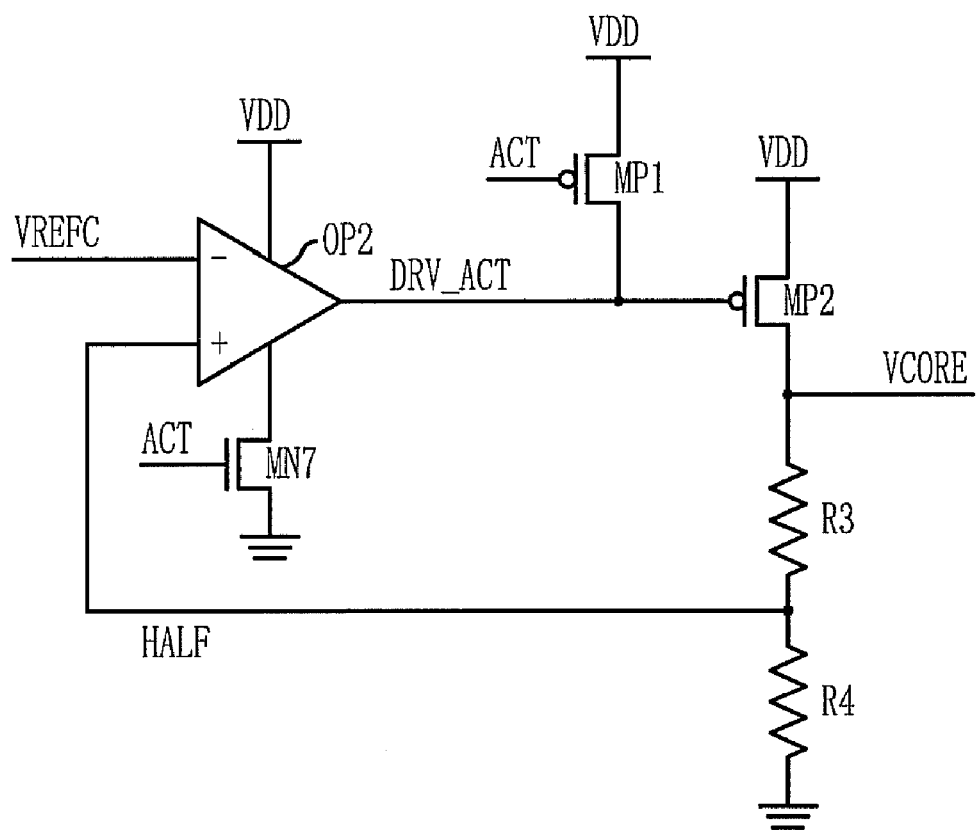
FIG. 3 is a circuit diagram of a conventional core voltage generator.
Figure 4:
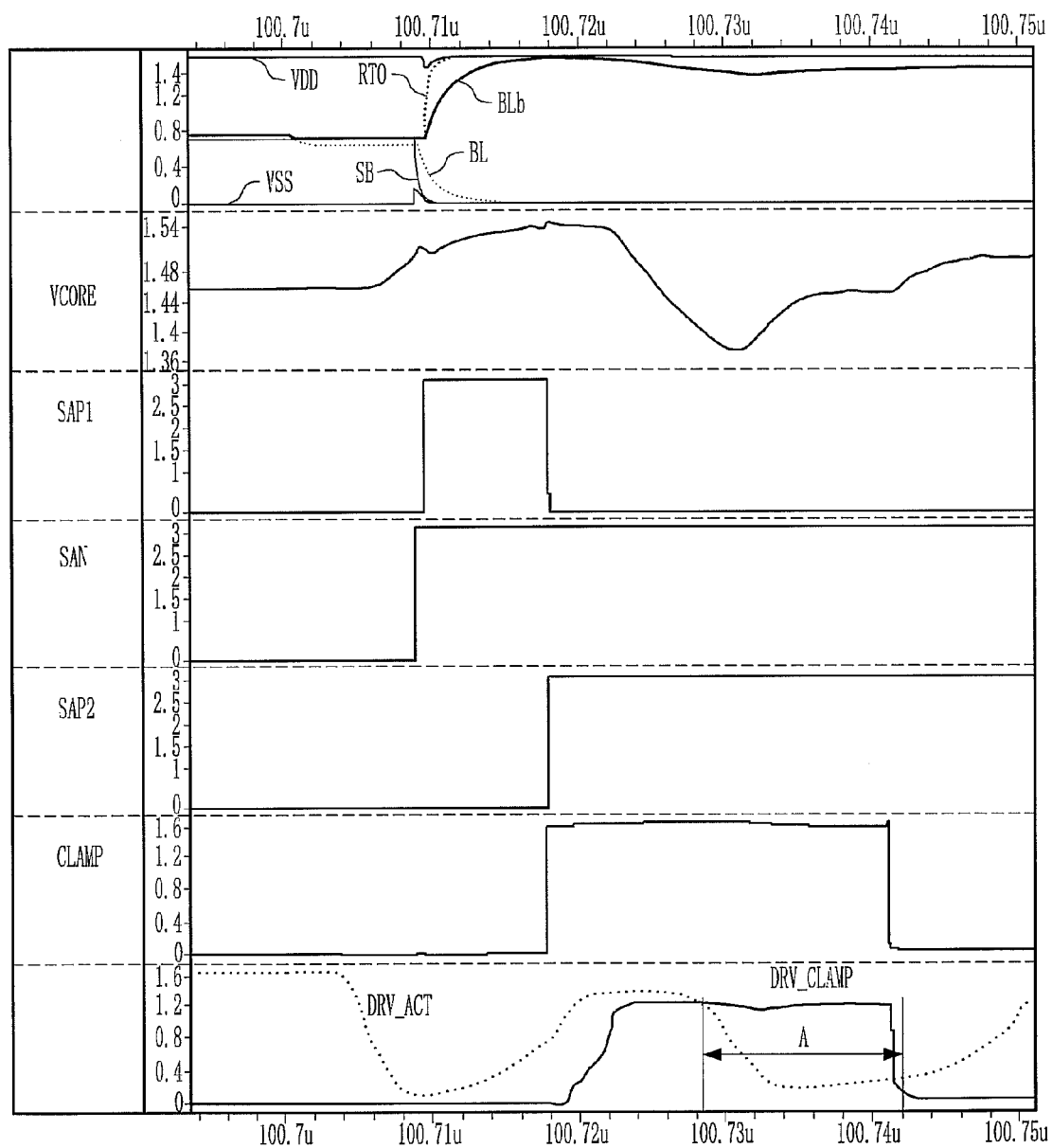
FIG. 4 is a timing diagram of a conventional core voltage discharging operation and core voltage generating operation.

The core voltage discharge driver is connected to an output terminal of the conventional core voltage discharge driver of FIG. 2 and an output terminal of the conventional core voltage generator of FIG. 3. By using feedback in comparing an output signal DRV_CLAMP of the op-amp OP1 in the conventional core voltage discharge driver and an output signal DRV_ACT of the op-amp OP2 in the conventional core voltage generator, the core voltage discharge driver controls a discharge operation of the core voltage VCORE in order that the discharge operation does not interrupt a generation operation of the core voltage VCORE.

An op-amp OP3 of the core voltage discharge driver receives the output signal DRV_CLAMP of the op-amp OP1 and the output signal DRV_ACT of the op-amp OP2.

In the core voltage discharge driver in accordance with the present invention, an NMOS transistor MN11 receives an output signal DET of the op-amp OP3 as a gate input and adjusts the output signal DRV_CLAMP of the op-amp OP1. An NMOS transistor MN12 is connected between the NMOS transistor MN11 and a ground voltage (VSS) terminal to control a current path between the NMOS transistor MN12 and the ground voltage (VSS) terminal. The NMOS transistor MN12 receives a final output signal OUT as a gate input.

A muting unit for muting the output signal DET of the op-amp OP3 in response to an inversion signal of an external clamp signal CLAMP is connected to an output terminal of the op-amp OP3. The muting unit includes an inverter IV2 and an NMOS transistor MN9. The inverter IV2 inverts the clamp signal CLAMP. The NMOS transistor MN9 is turned on in response to an output signal of the inverter IV2. The source terminal of the NMOS transistor MN9 is connected to the ground voltage (VSS) terminal. The op-amp OP3 is connected between a power supply voltage (VDD) terminal and the ground voltage (VSS) terminal. An NMOS transistor MN8 is connected between the op-amp OP3 and the ground voltage (VSS) terminal to open and close a current path between the power supply voltage (VDD) terminal and the ground voltage (VSS) terminal. The NMOS transistor MN8 is turned on in response to the external clamp signal CLAMP.

An inverter configured with a PMOS transistor MP3 and an NMOS transistor MN10 is connected to the output terminal of the op-amp OP3, and its output signal is inverted by an inverter IV3.

The operation of the core voltage discharge driver in accordance with the present invention is described below.

The conventional core voltage discharge driver in FIG. 2 discharges electric charges, which are transferred from the power supply voltage (VDD) terminal, to the ground voltage (VSS) terminal. That is, when the clamp signal CLAMP is in high level, the NMOS transistor MN4 is turned on to activate the op-amp OP1. The inverter IV1 inverters the clamp signal CLAMP of high level to turn off the NMOS transistor MN5. The output signal DRV_CLAMP of the op-amp OP1 is inputted to the discharge driving unit.

Dividing resistors R1 and R2 divide the core voltage VCORE to generate the half core voltage HALF, which is inputted to the op-amp OP1. The op-amp OP1 compares the half core voltage HALF with the reference voltage VREFC. When the half core voltage HALF becomes larger than the reference voltage VREFC, the output signal DRV_CLAMP of the op-amp OP1 increases and thus the NMOS transistor MN6 for discharge is turned on to decrease a level of the core voltage VCORE.

In the conventional core voltage generator in FIG. 3, when the active signal ACT is in high level, the NMOS transistor MN7 is turned on to activate the op-amp OP2. The PMOS transistor MP1 is turned off in response to the active signal ACT of high level, and the output signal DRV_ACT of the op-amp OP2 is inputted to the gate terminal of the driving unit.

Dividing resistors R3 and R4 divide the core voltage VCORE to generate the half core voltage HALF, which is inputted to the op-amp OP2. The op-amp OP2 compares the half core voltage HALF with the reference voltage VREFC. When the half core voltage HALF becomes less than the reference voltage VREFC, the output signal DRV_ACT of the op-amp OP2 decreases and thus the PMOS transistor MP2 is turned on to increase a level of the core voltage VCORE.

While the conventional core voltage discharge driver and the conventional core voltage generator operate as above described, the op-amp OP3 of the core voltage discharge driver compares the output signal DRV_CLAMP of the op-amp OP1 with the output signal DRV_ACT of the op-amp OP2. When a voltage level of the output signal DRV_CLAMP is higher than a voltage level of the output signal DRV_ACT, a voltage level of the output signal DET of the op-amp OP3 increases.

When the voltage level of the output signal DET is higher than a switching voltage of the inverter consisting of the two transistors MP3 and MN10, the PMOS transistor MP3 is turned off and the NMOS transistor MN10. Thus, the output signal OUT of the inverter IV3 becomes high level. At this time, the inverter configured with the two transistors and the inverter IV3 delays the output signal DET of the op-amp OP3 by a predetermined time determined by the two inverters.

The NMOS transistor MN11 is turned on in response to the output signal DET of the op-amp OP3, but the NMOS transistor MN12 maintains its turn off state until the output signal OUT is changed to high level. Thus, an output voltage of the op-amp OP1 is not discharged.

When the NMOS transistor MN12 is turned on in response to the output signal OUT of high level and the NMOS transistor MN11 is turned on in response to the output signal DRV_CLAMP of the op-amp OP1, the output voltage of the op-amp OP1 is charged, so that the voltage level of the output signal DRV_CLAMP of the op-amp OP1 decreases.

Figure 6:
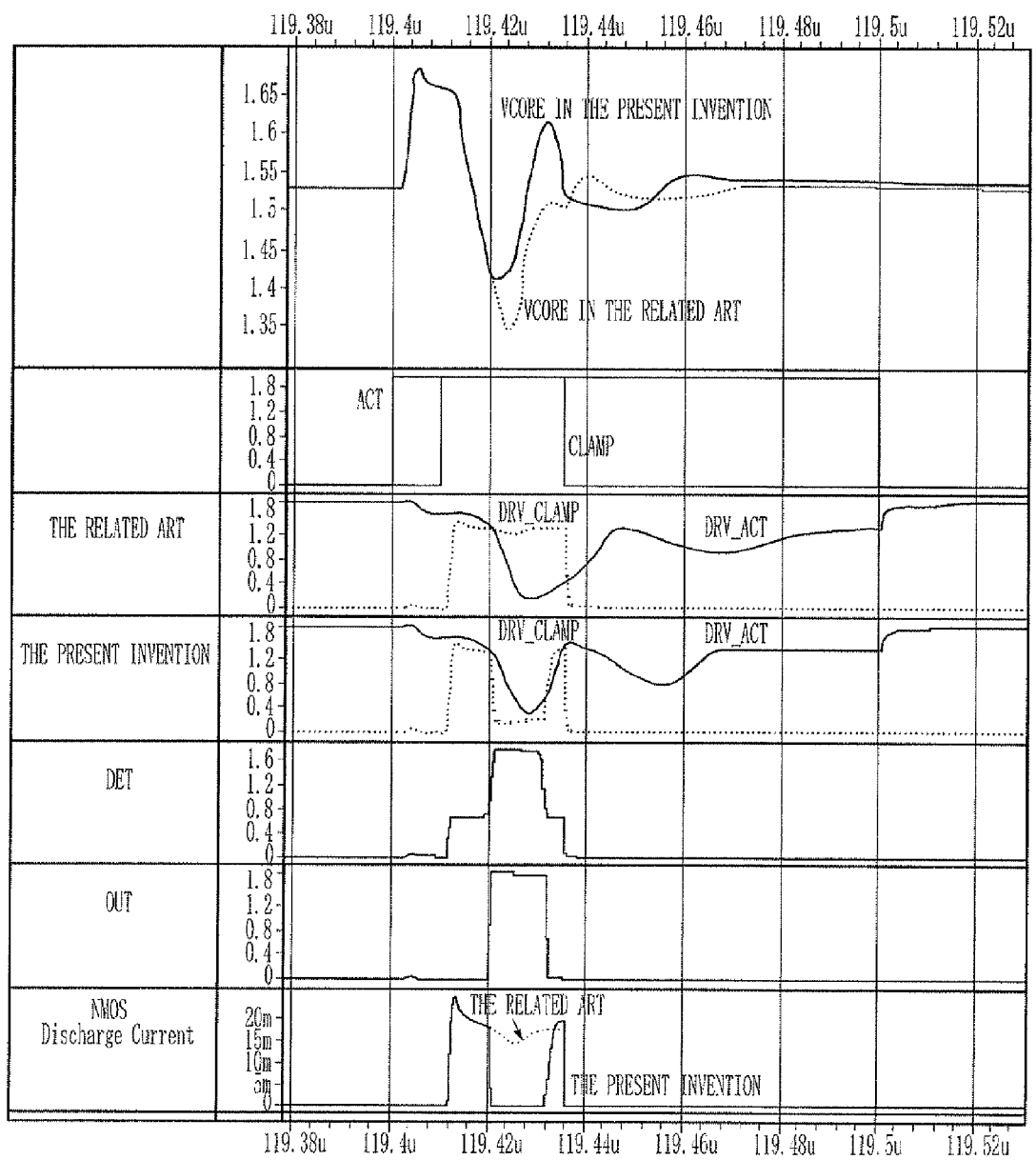
FIG. 6 is a timing diagram of a core voltage discharging operation and core voltage generating operation in accordance with the present invention.

FIG. 6 is a timing diagram of a core voltage discharging operation and core voltage generating operation in accordance with the present invention. Referring to FIG. 6, in a period in which the output signal OUT is in high level, the output signal DRV_CLAMP of the op-amp OP1 falls to low level, so that a magnitude of a core voltage VCORE drop in the present invention is reduced.

By limiting operation of the core voltage discharge driver in FIG. 2, the performance of the core voltage generator in FIG. 3 is improved, and thus the core voltage VCORE drop due to the core voltage discharging operation is compensated. As illustrated in FIG. 6, in the period in which the output signal OUT is in high level, the amount of current flowing across the NMOS transistor MN6, which serves as the discharge driving unit for discharging the core voltage VCORE, is reduced.

As described above, the core voltage discharge driver in accordance with the present invention prevents the core voltage discharging operation from interrupting the core voltage generating operation. For this purpose, the present invention compares a core voltage discharging control signal (i.e., the output signal DRV_CLAMP of the op-amp OP1) with a core voltage generating control signal (i.e., the output signal DRV_ACT of the op-amp OP2), and the comparison result is feedbacked to the output terminal of the op-amp OP1. Accordingly, the core voltage discharging operation can be controlled not to interrupt the core voltage generating operation.

While the present invention has been described with respect to the specific embodiments, it will be apparent to those skilled in the art that various changes and modifications may be made without departing from the spirit and scope of the invention as defined in the following claims.

What is claimed is:

1. A core voltage discharge driver, comprising:
   a comparing unit configured to compare a core voltage generating control signal with a core voltage discharging control signal; and
   an adjusting unit configured to adjust the core voltage discharging control signal based on a comparison result of the comparing unit.

2. The core voltage discharge driver as recited in claim 1, wherein the comparing unit includes an op-amp configured to receive the core voltage generating control signal and the core voltage discharging control signal.

3. The core voltage discharge driver as recited in claim 2, wherein the op-amp operates according to opening or closing of a current path between external voltage terminals connected to the op-amp by a clamp signal.

4. The core voltage discharge driver as recited in claim 2, wherein the adjusting unit controls the core voltage discharging control signal when a level of the core voltage discharging control signal is higher than a level of the core voltage generating control signal.

5. The core voltage discharge driver as recited in claim 4, wherein the adjusting unit includes a first transistor having a gate terminal configured to receive an output signal of the op-amp and a drain terminal configured to receive the core voltage discharging control signal.

6. The core voltage discharge driver as recited in claim 5, wherein the adjusting unit further includes a second transistor connected between the first transistor and a ground voltage terminal and configured to open and close a current path between the first transistor and the ground voltage terminal.

7. The core voltage discharge driver as recited in claim 6, wherein the adjusting unit further includes a delaying unit configured to delay the output signal of the op-amp, wherein an output signal of the delaying unit is inputted to a gate terminal of the second transistor.

8. The core voltage discharge driver as recited in claim 7, wherein the first transistor and the second transistor are NMOS transistors.

9. The core voltage discharge driver as recited in claim 8, further comprising a muting unit connected to an output terminal of the op-amp and configured to mute the output signal of the op-amp in response to a clamp signal.

10. The core voltage discharge driver as recited in claim 6, wherein the delaying unit includes:
    a first inverter configured with a PMOS transistor and an NMOS transistor connected in series between a power supply voltage terminal and the ground voltage terminal; and
    a second inverter configured to invert an output signal of the first inverter.

11. A core voltage discharge driver, comprising:
    a core voltage generating unit configured to generate a core voltage using an external voltage;
    a core voltage discharging unit configured to control discharge of the core voltage by comparing a first reference voltage with the core voltage fed back from the core voltage generating unit; and
    a discharge adjusting unit configured to compare a core voltage generating control signal with a core voltage discharging control signal, and to adjust a core voltage discharged in the core voltage discharging unit based on the comparison result.

12. The core voltage discharge driver as recited in claim 11, wherein the core voltage generating unit generates a core voltage using an external voltage when the fed backed core voltage is compared with a second reference voltage and the fed backed core voltage is smaller than the second reference voltage.

13. The core voltage discharge driver as recited in claim 11, wherein the core voltage discharging unit controls the discharge of the core voltage when the fed backed core voltage is compared with the first reference voltage and the fed backed core voltage is larger than the first reference voltage.

14. The core voltage discharge driver as recited in claim 11, wherein the discharge adjusting unit includes:
    an op-amp configured to compare the core voltage generating control signal with the core voltage discharging control signal;
    an adjuster configured to adjust the core voltage discharging control signal based on a value of an output signal of the op-amp;
    a delay configured to delay the output signal of the op-amp to control a current path coupled to the adjuster; and
    a muter configured to mute the output signal of the op-amp in response to an external clamp signal.

* * * * *